(12) United States Patent
Yang et al.

(10) Patent No.: US 10,826,513 B1
(45) Date of Patent: Nov. 3, 2020

(54) ANALOG TO DIGITAL CONVERTER WITH OFFSET-ADJUSTABLE COMPARATORS

(71) Applicant: NATIONAL CHENG KUNG UNIVERSITY, Tainan (TW)

(72) Inventors: Chung-Ming Yang, Tainan (TW); Tai-Haur Kuo, Tainan (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 16/556,770

(22) Filed: Aug. 30, 2019

(51) Int. Cl.
- *H03M 1/06* (2006.01)
- *H03K 5/24* (2006.01)
- *H03M 1/10* (2006.01)

(52) U.S. Cl.
CPC ........ *H03M 1/0607* (2013.01); *H03K 5/2481* (2013.01); *H03M 1/1023* (2013.01)

(58) Field of Classification Search
CPC .... H03M 1/0607; H03M 1/1023; H03M 1/12; H03K 5/2481; H03K 17/063
USPC .......................... 341/118, 120, 144, 155, 156
See application file for complete search history.

(56) References Cited

U.S. PATENT DOCUMENTS

| | | | | |
|---|---|---|---|---|
| 7,088,281 B1* | 8/2006 | Menkus | ............... | H03M 1/1033 341/118 |
| 7,289,054 B1* | 10/2007 | Watanabe | ............... | H03M 3/35 341/143 |
| 9,455,737 B1* | 9/2016 | Rajaee | ................... | H03M 3/464 |
| 9,571,115 B1* | 2/2017 | Beukema | ............ | H03M 1/1023 |
| 9,608,652 B2* | 3/2017 | Lee | ........................ | H03M 1/002 |
| 2013/0082854 A1* | 4/2013 | Keane | ................. | H03M 1/0678 341/120 |
| 2014/0104086 A1* | 4/2014 | Zhang | ................. | H03M 1/1009 341/120 |

* cited by examiner

*Primary Examiner* — Peguy Jean Pierre
(74) *Attorney, Agent, or Firm* — Rosenberg, Klein & Lee

(57) ABSTRACT

An analog to digital converter includes a coarse ADC circuit composed of L offset-adjustable comparators and a fine ADC circuit composed of M offset-adjustable comparators. Each offset-adjustable comparator in the coarse ADC circuit has a constant embedded offset. Each offset-adjustable comparator in the fine ADC circuit has an adaptive embedded offset digitally determined by outputs of the coarse ADC circuit. With the constant and adaptive embedded offsets, the analog to digital converter requires no resistor ladder. Therefore, power consumption and area of the analog to digital converter is reduced, and faster conversion speed is achieved.

10 Claims, 16 Drawing Sheets

| OACs | $D_{CTRLP}[0:2]$ | $D_{CTRLN}[0:2]$ | Constant offset | Value of the $V_{OST,C}$ |
|---|---|---|---|---|
| $Comp_{C6}$ | 111 | 000 | $V_{OS,C6}$ | $6/7V_{REF}$ |
| $Comp_{C5}$ | 011 | 000 | $V_{OS,C5}$ | $5/7V_{REF}$ |
| $Comp_{C4}$ | 001 | 000 | $V_{OS,C4}$ | $4/7V_{REF}$ |
| $Comp_{C3}$ | 000 | 100 | $V_{OS,C3}$ | $3/7V_{REF}$ |
| $Comp_{C2}$ | 000 | 110 | $V_{OS,C2}$ | $2/7V_{REF}$ |
| $Comp_{C1}$ | 000 | 111 | $V_{OS,C1}$ | $1/7V_{REF}$ |

FIG.5A

| Subrange region | D[0:5] of coarse ADC | $D_{CTRLP}=$ D[0:2] | $D_{CTRLN}=$ $\overline{D}$[3:5] | Value of adaptive offset $V_{OSAF}$ | Value of constant offset $V_{OS,F1}\sim V_{OS,F11}$ | Value of total offsets |
|---|---|---|---|---|---|---|
| Region 7 | 111111 | 111 | 000 | $27/63V_{REF}$ | $27/63V_{REF}\sim 37/63V_{REF}$ | $54/63V_{REF}\sim 64/63V_{REF}$ |
| Region 6 | 011111 | 011 | 000 | $18/63V_{REF}$ | $27/63V_{REF}\sim 37/63V_{REF}$ | $45/63V_{REF}\sim 55/63V_{REF}$ |
| Region 5 | 001111 | 001 | 000 | $9/63V_{REF}$ | $27/63V_{REF}\sim 37/63V_{REF}$ | $36/63V_{REF}\sim 46/63V_{REF}$ |
| Region 4 | 000111 | 000 | 000 | 0 | $27/63V_{REF}\sim 37/63V_{REF}$ | $27/63V_{REF}\sim 37/63V_{REF}$ |
| Region 3 | 000011 | 000 | 100 | $-9/63V_{REF}$ | $27/63V_{REF}\sim 37/63V_{REF}$ | $18/63V_{REF}\sim 28/63V_{REF}$ |
| Region 2 | 000001 | 000 | 110 | $-18/63V_{REF}$ | $27/63V_{REF}\sim 37/63V_{REF}$ | $9/63V_{REF}\sim 19/63V_{REF}$ |
| Region 1 | 000000 | 000 | 111 | $-27/63V_{REF}$ | $27/63V_{REF}\sim 37/63V_{REF}$ | $0\sim 10/63V_{REF}$ |

FIG.5B

ANALOG TO DIGITAL CONVERTER WITH OFFSET-ADJUSTABLE COMPARATORS

BACKGROUND OF THE INVENTION

1. Field of the Invention

The present invention relates to an analog to digital converter (ADC), and particularly to an analog to digital converter with offset-adjustable comparators.

2. Description of the Related Art

Portable device systems based on standards such as ultra-wideband (UWB) and wireless personal area networks (WPANs) require moderate-resolution analog-to-digital converters (ADCs). Some well-known ADC architectures, including the flash ADC, the time-interleaved successive-approximation register (SAR) ADC, and the subranging ADC may be applied to the foregoing applications.

With reference to FIG. 9, the conventional flash ADC uses a resistor ladder to generate different reference voltages applied to compactors. Although the flash ADC is used for high-speed applications, a static current flowing through the resistor ladder will cause extra power consumption and the large amount of the comparators will require a relative large area. In short, the area and power consumption increase exponentially with the resolution of the flash ADC.

With reference to FIG. 10, the conventional SAR ADC has good area and power efficiency. Thus, the conventional SAR ADC with time-interleaved technique can achieve high speed conversion and have good power efficiency in comparison to the flash ADC. However, interleaved mismatches among the channels of the time-interleave SAR ADC decrease its performance.

With reference to FIG. 11, as an alternative, the conventional subranging ADC is a trade-off between the flash ADC and the time-interleave SAR ADC. The conventional subranging ADC comprises a coarse ADC circuit, a fine ADC circuit, a multiplexing circuit and a resistor ladder. The static current flowing through the resistor ladder results in extra power consumption. Further, because the resistor ladder is controlled by the multiplexing circuit to provide reference voltages to the coarse ADC circuit and the fine ADC circuit, the settling time of the reference-voltage switching between the coarse ADC circuit and the fine ADC circuit limits the operation speed, i.e. A/D conversion speed.

SUMMARY OF THE INVENTION

An objective of the present invention is to provide an analog to digital converter (ADC) with offset-adjustable comparators.

The analog to digital converter comprises:
a track and hold circuit, tracking and holding an analog input signal to generate a sampled input signal;
a clock generator generating clock signals;
a coarse analog-to-digital conversion (ADC) circuit coupled to the track and hold circuit and comprising L offset-adjustable comparators to generate an L-bit output code, wherein each offset-adjustable comparator has a constant embedded offset for comparing with the sampled input signal;
a fine analog-to-digital conversion (ADC) circuit coupled to the track and hold circuit and comprising M offset-adjustable comparators to generate a M-bit output code, wherein each of the offset-adjustable comparator has an adaptive embedded offset that is determined by the L-bit output code of the coarse ADC circuit for comparing with the sampled input signal; and
an encoder combining the L-bit output code of the coarse ADC circuit and the M-bit output code of the fine ADC circuit to output a N-bit digital signal.

Other objectives, advantages and novel features of the invention will become more apparent from the following detailed description when taken in conjunction with the accompanying drawings.

BRIEF DESCRIPTION OF THE DRAWINGS

FIG. 5A shows the mapping table of the coarse ADC circuit of the present invention;

FIG. 5B shows the logic table of the fine ADC circuit of the present invention;

DETAILED DESCRIPTION OF THE INVENTION

Figure 1:
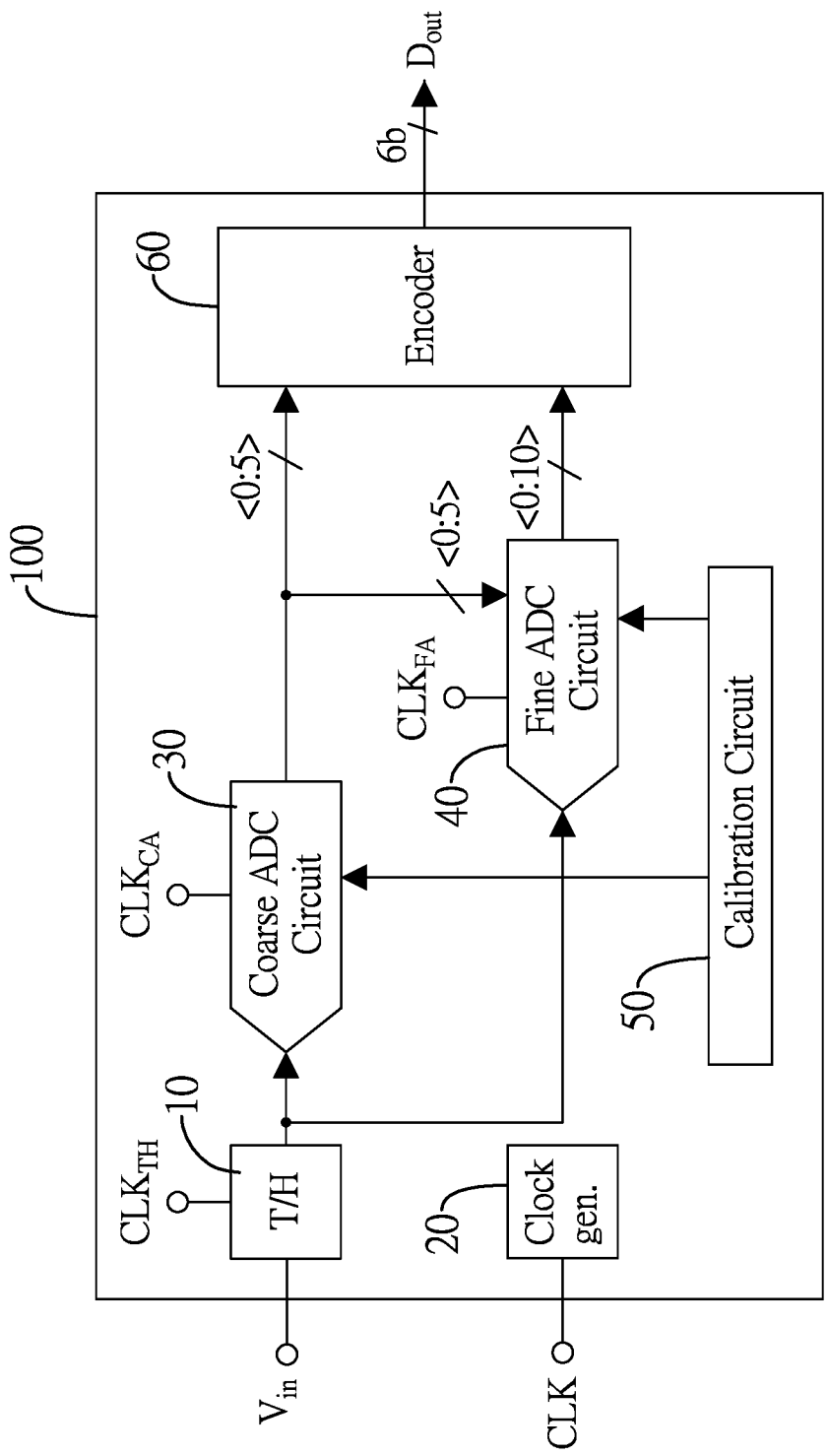
FIG. 1 is a circuit block diagram of an analog-to-digital converter (ADC) of the present invention.

With reference to FIG. 1, an analog-to-digital converter (ADC) 100 with offset-adjustable comparators of the present invention comprises a track and hold (T/H) circuit 10, a clock generator 20, a coarse ADC circuit 30, a fine ADC circuit 40 and an encoder 60. In this embodiment, the analog-to-digital converter 100 is a 6-bit converter for converting an analog input signal $V_{in}$ to a 6-bit digital signal $D_{out}$. In another embodiment, the analog-to-digital converter (ADC) 100 further comprises a calibration circuit 50.

The track and hold circuit 10, comprising two PMOS switches with feed-through compensation, tracks the analog input signal $V_{in}$ and accordingly outputs differential input signals ($V_{IN,\,P}$ and $V_{IN,\,N}$).

The clock generator 20 generates clock signals required by the analog-to-digital converter (ADC) 100.

The encoder 60 combines A/D conversion results of the coarse ADC circuit 30 and the fine ADC circuit 40 to generate the 6-bit digital signal $D_{out}$ of the analog-to-digital converter 100.

Figure 2:
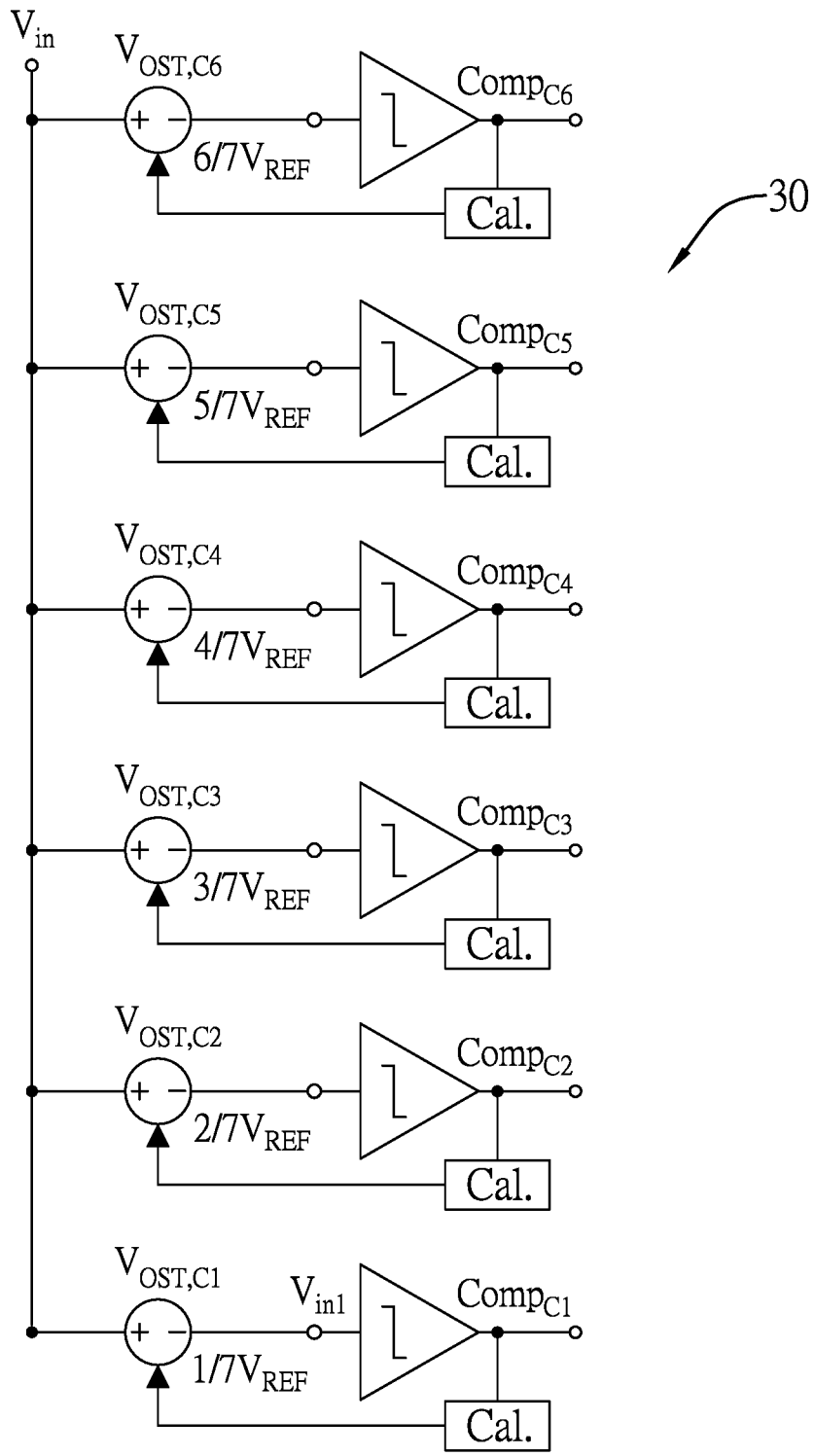
FIG. 2 is a circuit block diagram of a coarse ADC circuit of the present invention.

With reference to FIG. 2, the coarse ADC circuit 30 is implemented by 6 offset-adjustable comparators (OAC$_s$) Comp$_{C1}$ to Comp$_{C6}$ in this embodiment to generate a 6-bit output code D[0:5], wherein constant embedded offsets $V_{OST,C1}$ to $V_{OST,C6}$ are added to the respective offset-adjustable comparators Comp$_{C1}$ to Comp$_{C6}$ to offer reference voltages $1/7V_{REF}$ to $6/7V_{REF}$. A difference between two adjacent constant embedded offsets is $1/7V_{REF}=9V_{LSB}$. Therefore, resistor ladder is eliminated in the coarse ADC circuit 30. Taking the first offset-adjustable comparator Comp$_{C1}$ as an example, the first offset-adjustable comparator Comp$_{C1}$ compares the analog input signal $V_{in}$ with the constant embedded offsets $V_{OST,C1}$, i.e. $V_{in1}=V_{in}-V_{OST,C1}=V_{in}-1/7V_{REF}$.

Figure 3:
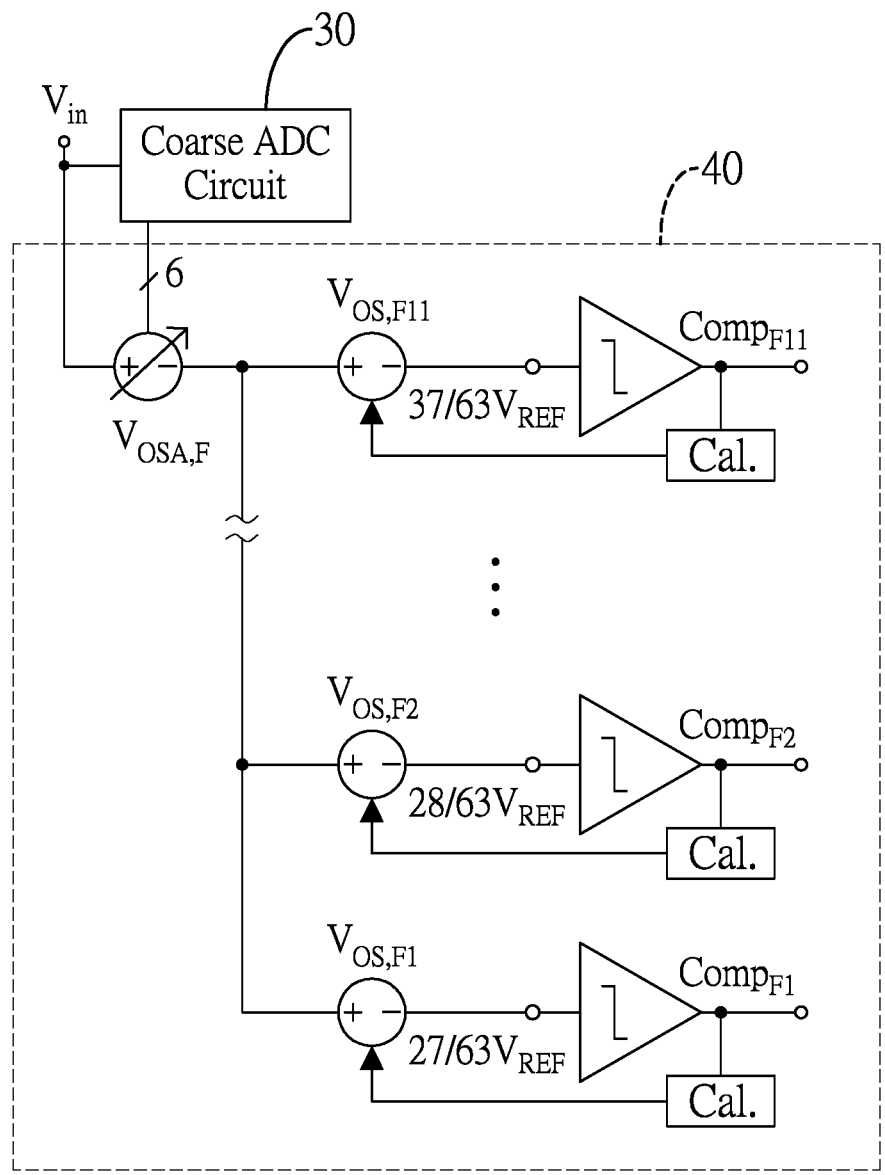
FIG. 3 is a circuit block diagram of a fine ADC circuit of the present invention.

With reference to FIG. 3, the fine ADC circuit 40 is implemented by 11 offset-adjustable comparators Comp$_{F1}$ to Comp$_{F11}$. Two types of offsets are applied to the fine ADC circuit 40, i.e. the constant offsets $V_{OS,F1}$ to $V_{OS,F11}$ and adaptive offset $V_{OSA,F}$. The constant offsets $V_{OS,F1}$ to $V_{OS,F11}$ are added to the offset-adjustable comparators Comp$_{F1}$ to Comp$_{F11}$ respectively and the adaptive offset $V_{OSA,F}$ is added to each offset-adjustable comparator Comp$_{F1}$ to Comp$_{F11}$. The constant offsets $V_{OS,F1}$ to $V_{OS,F11}$ are respectively $27/63V_{REF}$ to $37/63V_{REF}$ with a difference between two adjacent constant offsets being $1/63V_{REF}=1V_{LSB}$. The adaptive offset $V_{OSA,F}$ has an adjustable range from $-27/63V_{REF}$ to $27/63V_{REF}$ with a step of $9/63VREF=9V_{LSB}$ and is adjusted by the output code of the coarse ADC circuit 30.

An analog-to-digital converter (ADC) 100 outputting an N-bit digital signal needs $2^N$ LSB (least significant bit). The number (L) of the offset-adjustable comparators of the coarse ADC circuit 30 and the number (M) of the offset-adjustable comparators of the fine ADC circuit 40 should meet the relationship:

$$(L+1)*(M+1) \geq 2^N.$$

In this embodiment, the coarse ADC circuit 30 is composed of six (L=6) offset-adjustable comparators Comp$_{C1}$ to Comp$_{C6}$ and the fine ADC circuit 40 is composed of 11 (M=11) offset-adjustable comparators Comp$_{F1}$ to Comp$_{F11}$ to meet the foregoing relationship $(L+1)*(M+1)=84 \geq 2^6$.

Figure 4A:
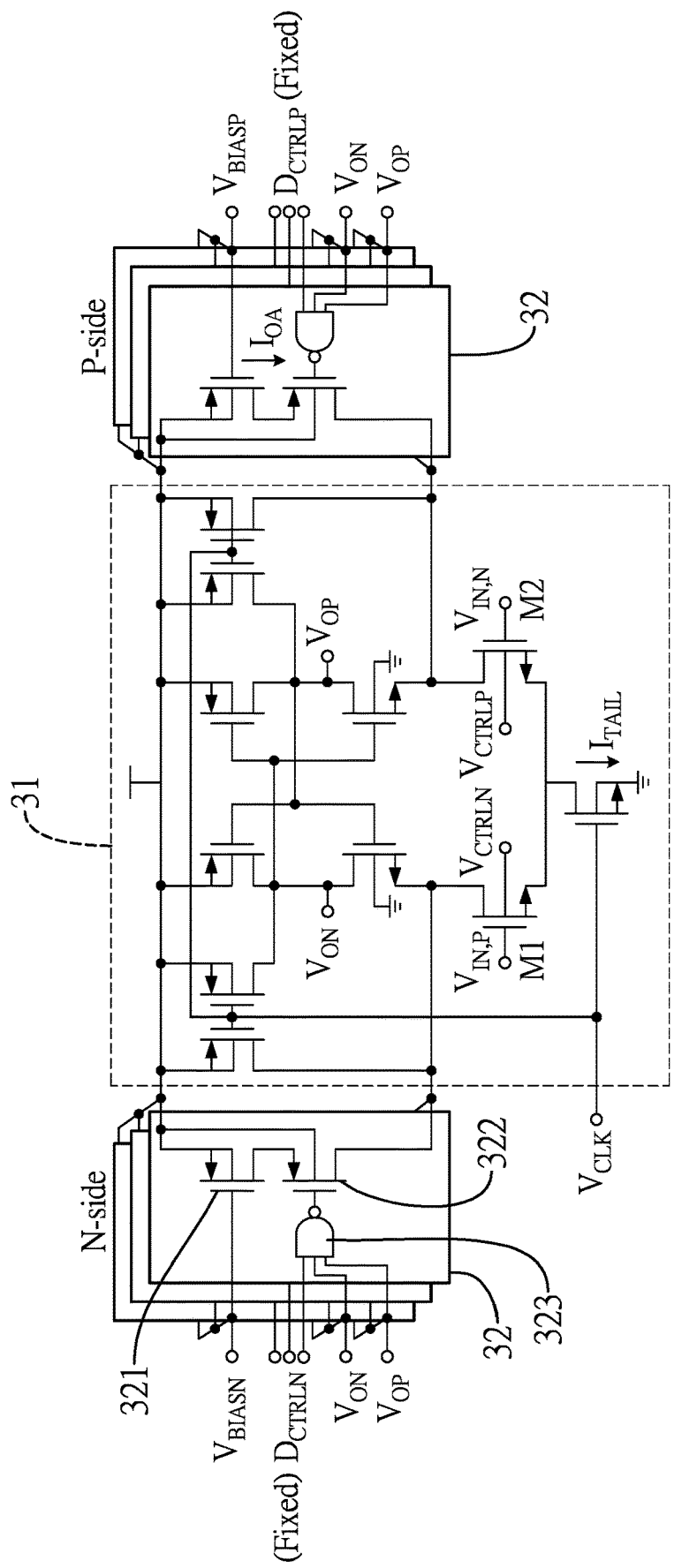
FIG. 4A is a circuit diagram of an offset-adjustable comparator (OAC) in the coarse ADC circuit of the present invention.
Figure 4B:
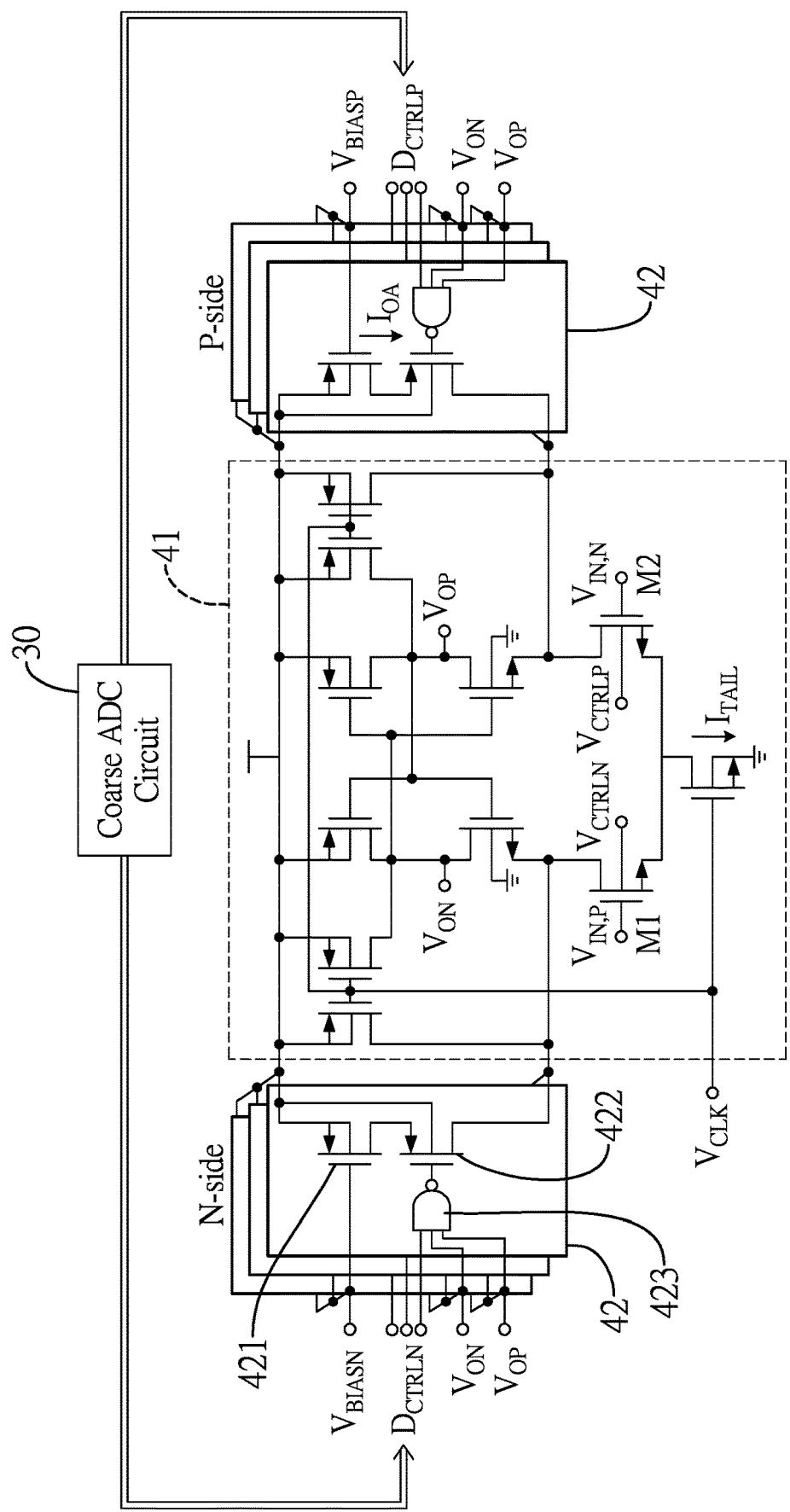
FIG. 4B is a circuit diagram of an offset-adjustable comparator (OAC) in the fine ADC circuit of the present invention.

With reference to FIGS. 4A and 4B, both the coarse ADC circuit 30 and the fine ADC circuit 40 have the same offset-adjustable comparator architecture to simplify circuit design.

As shown in FIG. 4A, each of the offset-adjustable comparators Comp$_{C1}$ to Comp$_{C6}$ of the coarse ADC circuit 30 comprises a dynamic comparator 31 and six offset-adjustment cells 32. For example, in the first offset-adjustable comparator Comp$_{C1}$, the dynamic comparator 31 has a pair of input NMOS transistors M1, M2, wherein the two input NMOS transistors M1, M2 have tunable body voltages $V_{CTRLN}$, $V_{CTRLP}$ to produce a small constant offset component $V_{OS,C1}$. Three of the six offset-adjustment cells 32 are commonly connected as a group at N-side and coupled to the input NMOS transistor M1, while the other three offset-adjustment cells 32 are commonly connected as another group at P-side and coupled to the other input NMOS transistor M2. Each offset-adjustment cell 32 comprises a current source 321, a PMOS switch 322 having a control terminal and a three-input NAND gate 323 having an output terminal coupled to the control terminal. Each offset-adjustment cell 32 produces an offset value, 0 or $9V_{LSB}$, which is digitally controlled by input values $D_{CTRLN}$ and $D_{CTRLP}$ of the NAND gate 323.

FIG. 5A showing the mapping table of the coarse ADC circuit 30, by implementing the architecture shown in FIG. 4A for the 6 offset-adjustable comparators Comp$_{C1}$ to Comp$_{C6}$ in the coarse ADC circuit 30, the input values $D_{CTRLN}$ and $D_{CTRLP}$ of the NAND gates 323 are fixed values. For example, in the first OAC Comp$_{C1}$, a constant input $D_{CTRLN}$ "111" is input to the three NAND gates 323 to turn on the three PMOS switches 323 at the N-side, and another constant input $D_{CTRLP}$ "000" is input to the three NAND gates 323 to turn off the PMOS switches 322 at the P-side. With the constant inputs $D_{CTRLN}$ and $D_{CTRLP}$, the six offset-adjustment cells 32 corporately generate a large constant offset component $V_{OSA, C1}$. Therefore, the constant embedded offset $V_{OST,C1}$ of the first offset-adjustable comparator Comp$_{C1}$ can be expressed by:

$$V_{OST,C1}=V_{OS,C1}+V_{OSA,C1}=1/7V_{REF}.$$

Taking the second offset-adjustable comparator Comp$_{C2}$ as another example, the constant input $D_{CTRLN}$ "110" is input to the three NAND gates 323 to turn on two of the three PMOS switches 323 at the N-side, and another constant input $D_{CTRLP}$ "000" is input to the three NAND gates 323 to turn off all the PMOS switches 322 at the P-side. The six offset-adjustment cells 32 and the body voltages $V_{CTRLN}$, $V_{CTRLP}$ corporately generate the constant embedded offset $V_{OST, C2}=2/7V_{REF}$ of the second offset-adjustable comparator Comp$_{C2}$.

When the dynamic comparator 31 finishes the comparison, either the output $V_{ON}$ or $V_{OP}$ of the dynamic comparator 31 will be set to "0" and input to the offset-adjustment cells 32. When the NAND gates 323 receives the "0" value, the PMOS switches 322 will be turned off by the NAND gates 323. Thus, the self-turn-off mechanism for the offset-adjustment cells 32 can reduce power consumption.

With reference to FIG. 4B, each of the offset-adjustable comparators Comp$_{F1}$ to Comp$_{F11}$ of the fine ADC circuit 40 also comprises a dynamic comparator 41 and six offset-adjustment cells 42. Each of the offset-adjustment cells 42 comprises a current source 421, a PMOS switch 422 and a three-input NAND gate 423. The two input NMOS transistors M1, M2 have tunable body voltages $V_{CTRLN}$, $V_{CTRLP}$ to produce a small constant offset $V_{OS,F}$. Differing from the coarse ADC circuit 30, the fine ADC circuit 40 requires an adaptive offset $V_{OSA,F}$ and the input values $D_{CTRLN}$ and $D_{CTRLP}$ applied to the NAND gates 423 are directly determined by the output code D[0:5] of the coarse ADC circuit 30.

FIG. 5B showing the logic table of the fine ADC circuit 40, the first three bits D[0:2] of the output code of the coarse ADC circuit 30 are taken as the input $D_{CRTLP}$ of the NAND gates 423 at the P-side, while the invert of the last three bits D[3:5] of the output code of the coarse ADC circuit 30 are taken as the input $D_{CRTLN}$ of the NAND gates 423 at the N-side. The value of the adaptive offset $V_{OSA,F}$ depends on the output code of the coarse ADC circuit 30. Thus, a total offset, $V_{OSA,F}+V_{OS,F}$, is adjustable to correspond to the region where the analog input signal $V_{in}$ is located.

Figure 6:
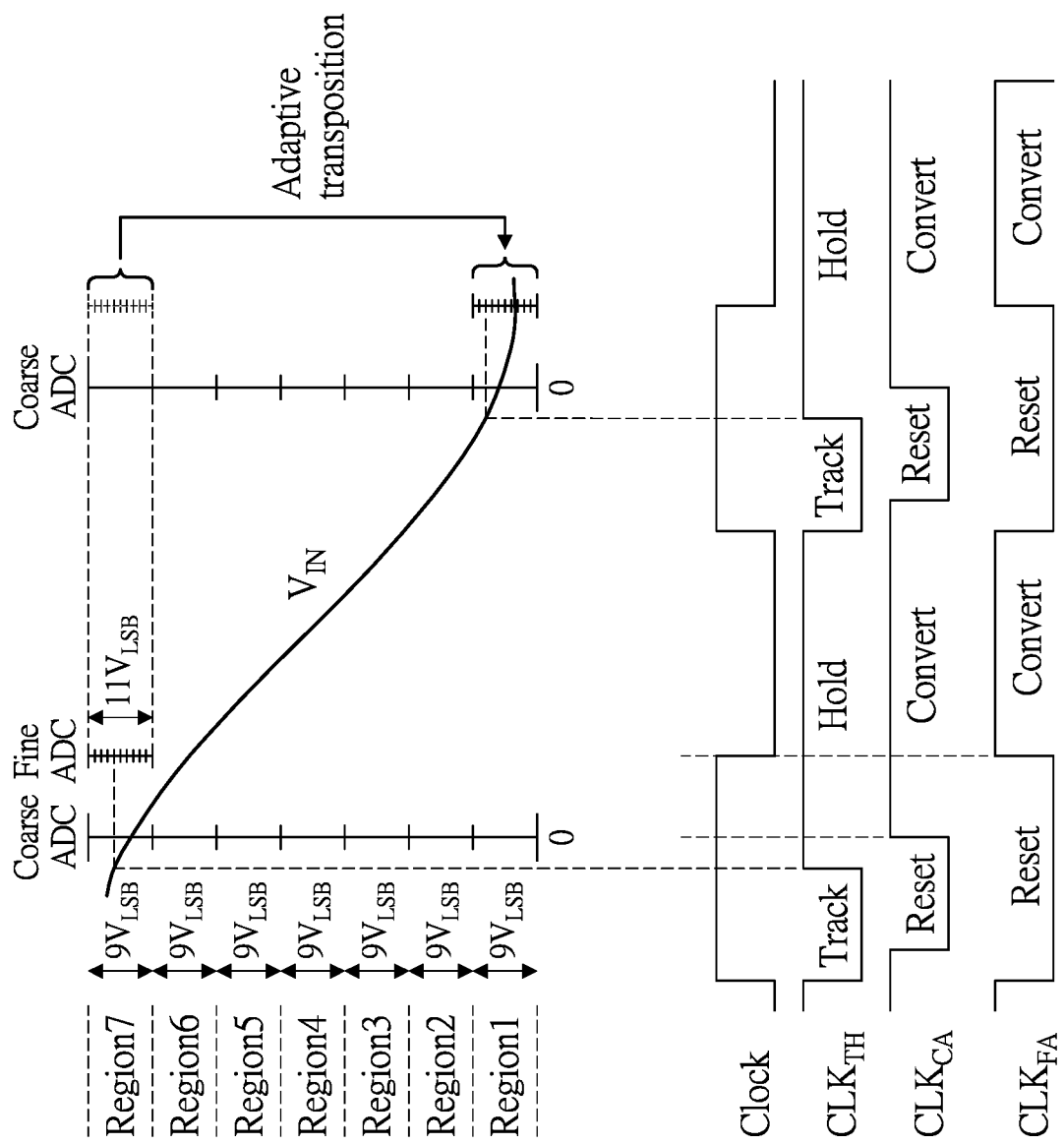
FIG. 6 shows a timing diagram of analog-to-digital conversion of the present invention.

With reference to FIG. 6, different clock signals for the track and hold circuit 10, the coarse ADC circuit 30 and the fine ADC circuit 40 are respectively illustrated and denoted as CLK$_{TH}$, CLK$_{CA}$ and CLK$_{FA}$. When the clock signal CLK$_{TH}$ is changed from the low level to the high level, the analog input signal $V_{in}$ can be sampled to obtain a sampled input value. The coarse ADC circuit 30, while the clock signal $CLK_{CA}$ is changed to the high level, performs A/D conversion and generates the 6-bit output code D[0:5]. The output codes D[0:2] and $\overline{D}$[3:5] of the coarse ADC circuit 30 are used to determine the input signal region that controls the OACs $Comp_{F1}$ to $Comp_{F11}$ of the fine ADC circuit 40 to transpose the adaptive offset $V_{OSA,F}$ to its corresponding region, for example from region 7 to region 1, after which the fine ADC circuit 40 acquires the analog input signal $V_{in}$ and completes the subranging A/D conversion.

Figure 7:
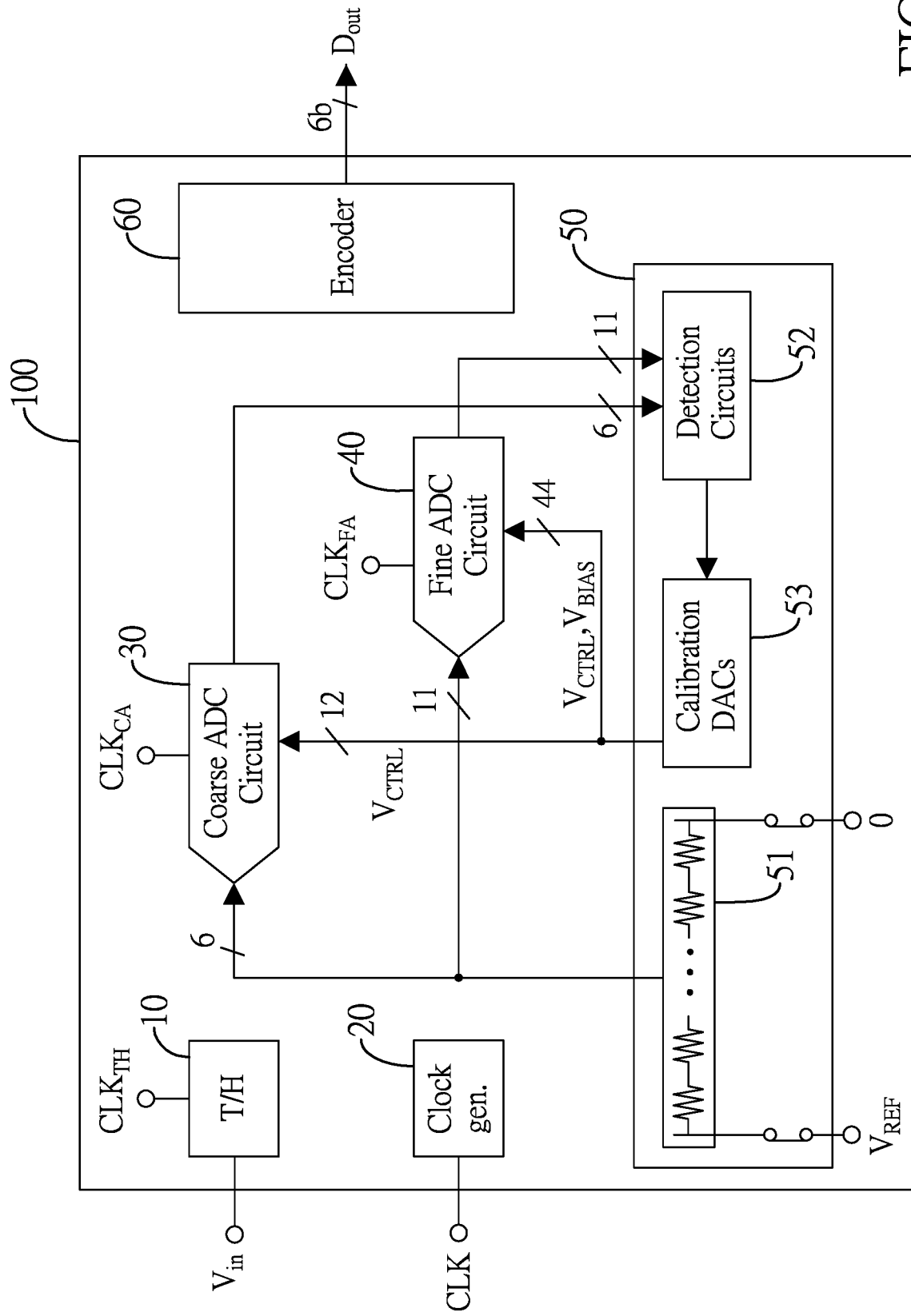
FIG. 7 is a circuit block diagram of a calibration circuit of the present invention.

With reference to FIG. 7, the analog-to-digital converter (ADC) 100 further comprises a calibration circuit 50. The calibration circuit 50 comprises an auxiliary resistor ladder 51, a plurality of detection circuits 52 and a plurality of calibration DACs 53. During start up, the auxiliary resistor ladder 51 provides the required reference voltages to the respective inputs of the offset-adjustable comparators. It is noted that after the calibration, the auxiliary resistor ladder 51 is turned off to save power. Meanwhile the detection circuit 52 detects each offset-adjustable comparator's polarity and the calibration DACs 53 individually tune their body voltages, $V_{CTRLN}$ and $V_{CTRLP}$, until the offset error is minimized. Then the digital input codes supplied from the detection circuits 52 to the calibration DACs 53 are stored and the required constant offset $V_{OS,C}$ and $V_{OS,F}$ are fixed.

Figure 8A:
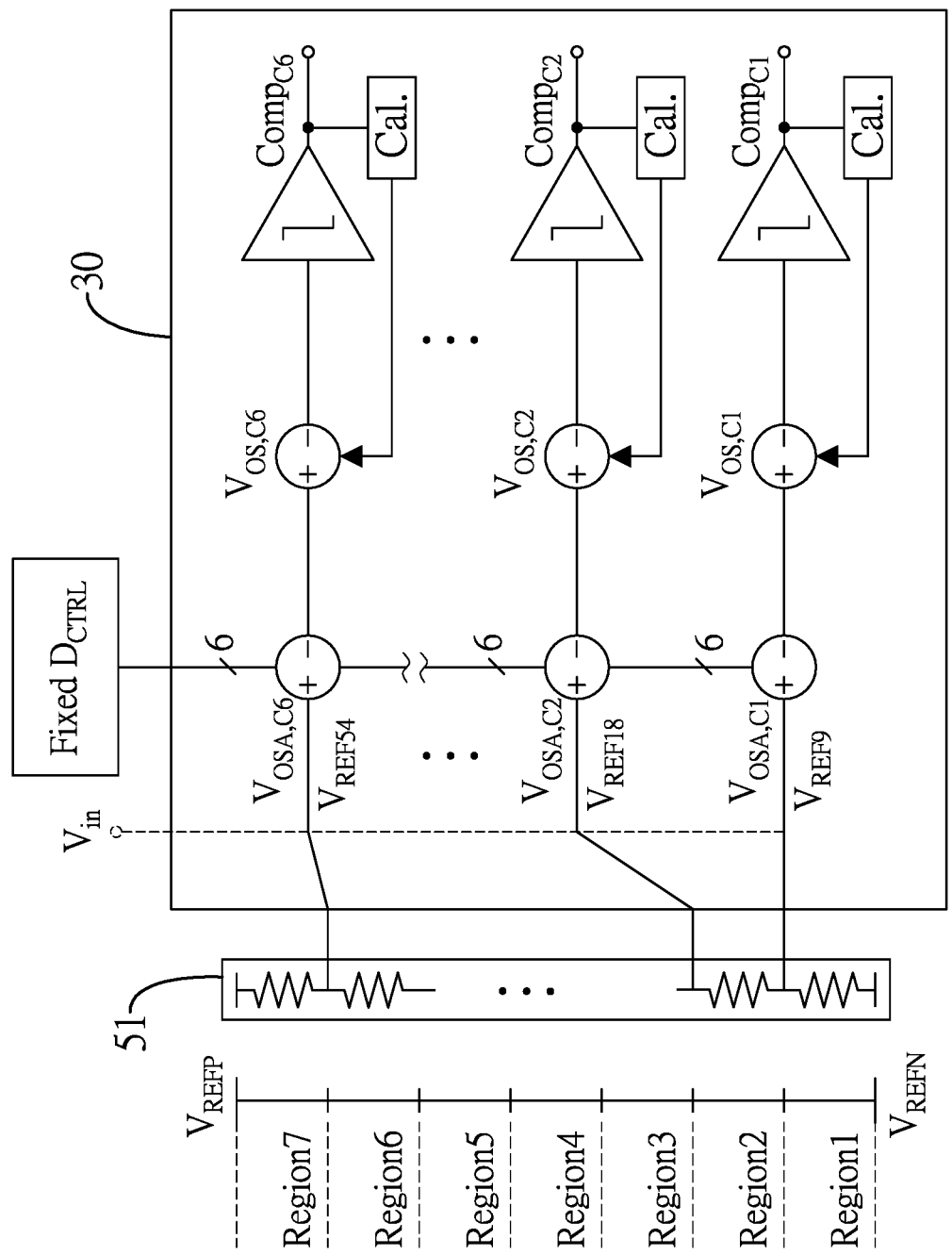
FIG. 8A shows body voltages calibration for the offset-adjustable comparator (OAC) in the coarse ADC circuit of the present invention.

For example, as shown in FIG. 8A, the resistor ladder 51 provides reference voltages $V_{REF9}$, $V_{REF18}$ ... $V_{REF54}$ to the respective inputs of the offset-adjustable comparators $Com_{C1}$ to $Com_{C6}$ of the coarse ADC circuit 30, meanwhile, the input values $D_{CTRLN}$ and $D_{CTRLP}$ are fixed values as recited in the mapping table shown in FIG. 5A. The calibration DACs 53 individually tune the body voltages, $V_{CTRLN}$ and $V_{CTRLP}$ of the input NMOS transistor M1, M2 in each offset-adjustable comparators $Com_{C1}$ to $Com_{C6}$ until the offset error is minimized.

Figure 8B:
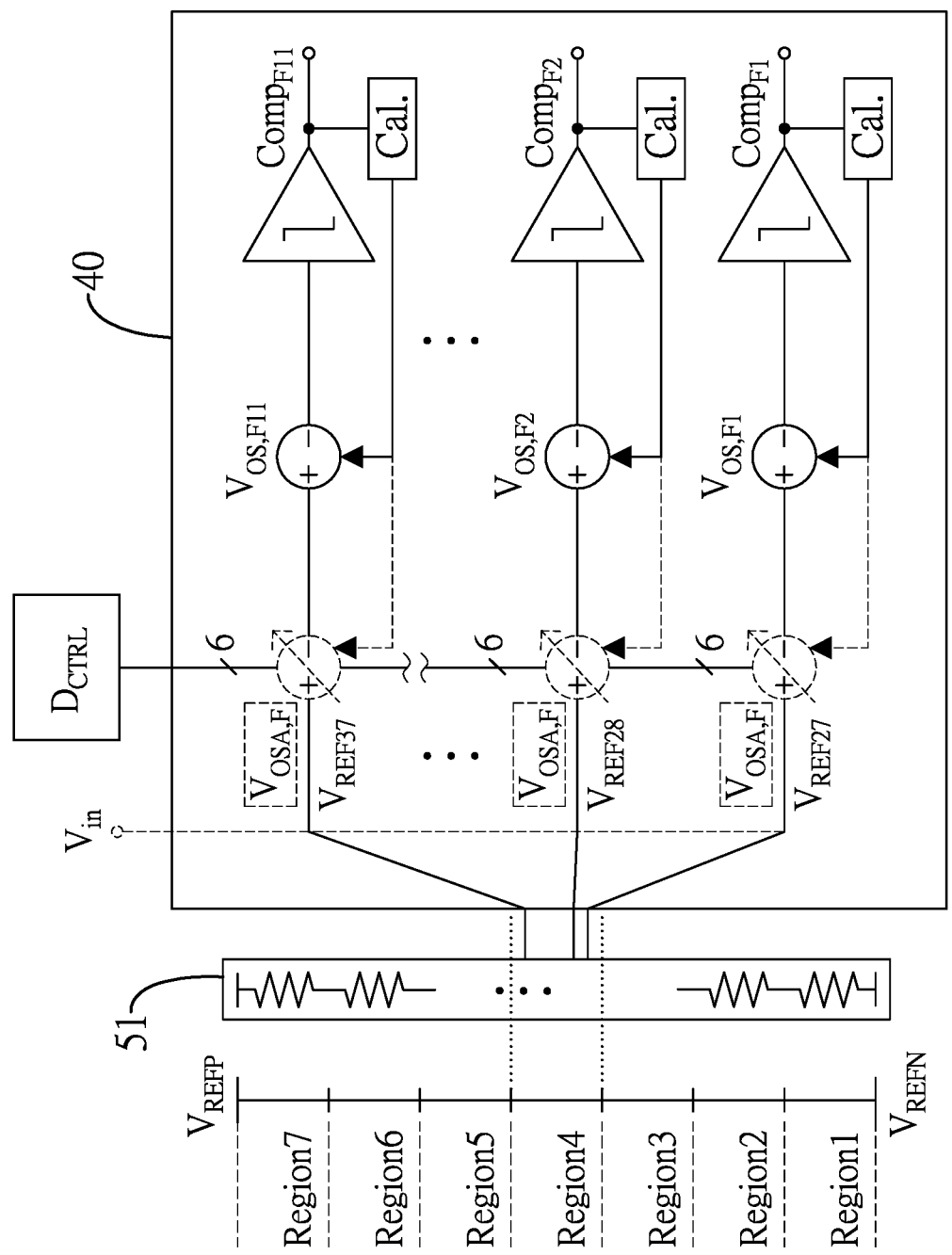
FIG. 8B shows body voltages calibration for the offset-adjustable comparator (OAC) in the fine ADC circuit of the present invention.

As shown in FIG. 8B, the resistor ladder 51 provides reference voltages $V_{REF27}$, $V_{REF28}$ ... $V_{REF37}$ to the respective inputs of the offset-adjustable comparators $Com_{F1}$ to $Com_{F11}$ of the fine ADC circuit 40, meanwhile, the input values $D_{CTRLN}$ and $D_{CTRLP}$ are set to 0 to turn off all the PMOS switches 422. The calibration DACs 53 individually tune the body voltages, $V_{CTRLN}$ and $V_{CTRLP}$ of the input NMOS transistor M1, M2 in each offset-adjustable comparators $Com_{F1}$ to $Com_{F11}$ until the offset error is minimized.

Figure 8C:
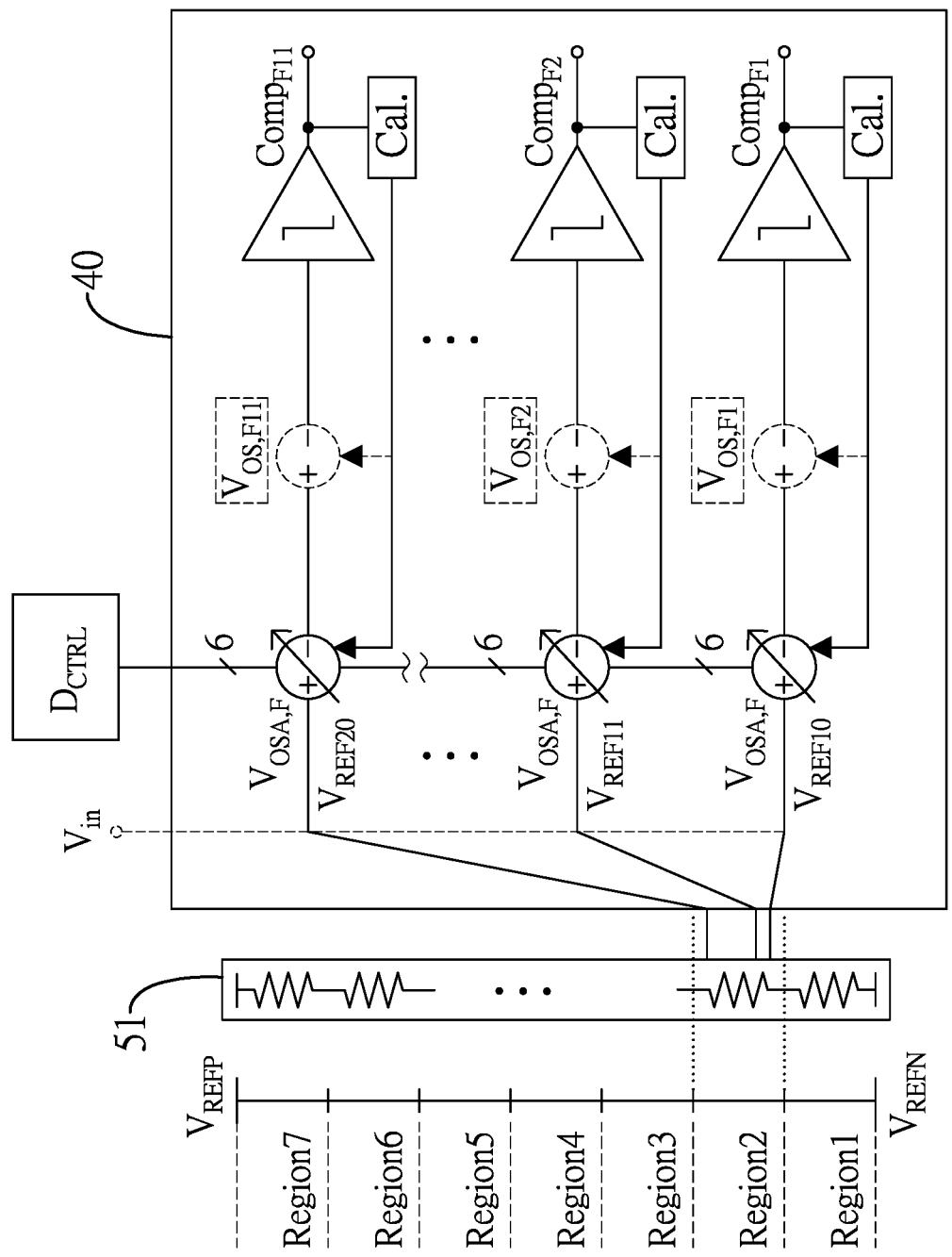
FIG. 8C shows $V_{BIASN}$ calibration for the office-adjustment cells at the N-Side of the fine ADC circuit.

With reference to FIG. 8C, to calibrate the bias voltage $V_{BIASN}$ of the three offset-adjustment cells 42 at the N-side of the fine ADC circuit 40, the input $D_{CRTLN}$ of the NAND gates 423 at the N-side is set to $D_{CRTLN}$=[110] and another input $D_{CRTLP}$ of the NAND gates 423 at the P-side is set to $D_{CRTLP}$=[000]. Because the three offset-adjustment cells 42 at the N-side share the same $V_{BIASN}$, only the calibration in region 2 is performed.

Figure 8D:
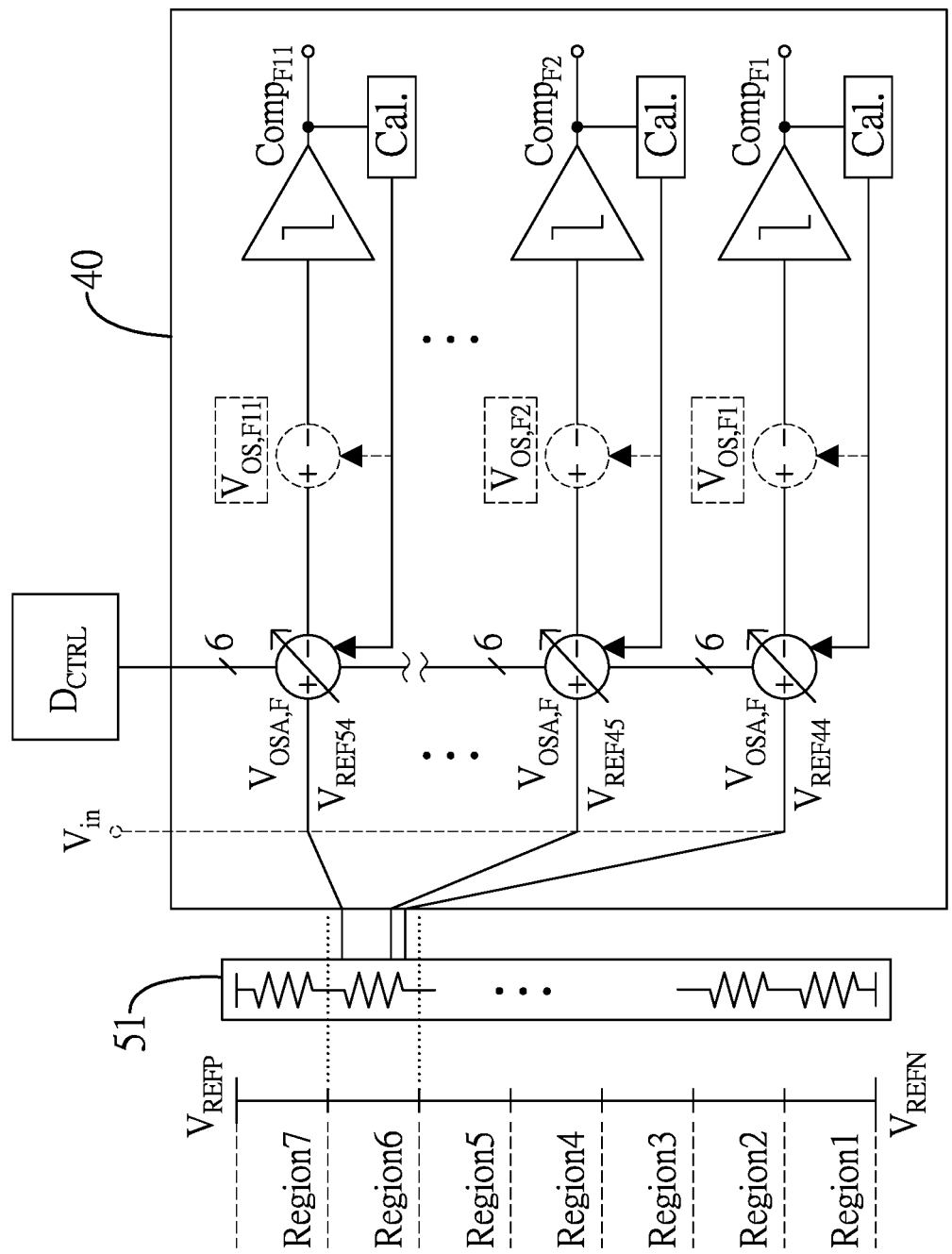
FIG. 8D shows $V_{BIASP}$ calibration for the office-adjustment cells at the P-Side of the fine ADC circuit.
Figure 9:
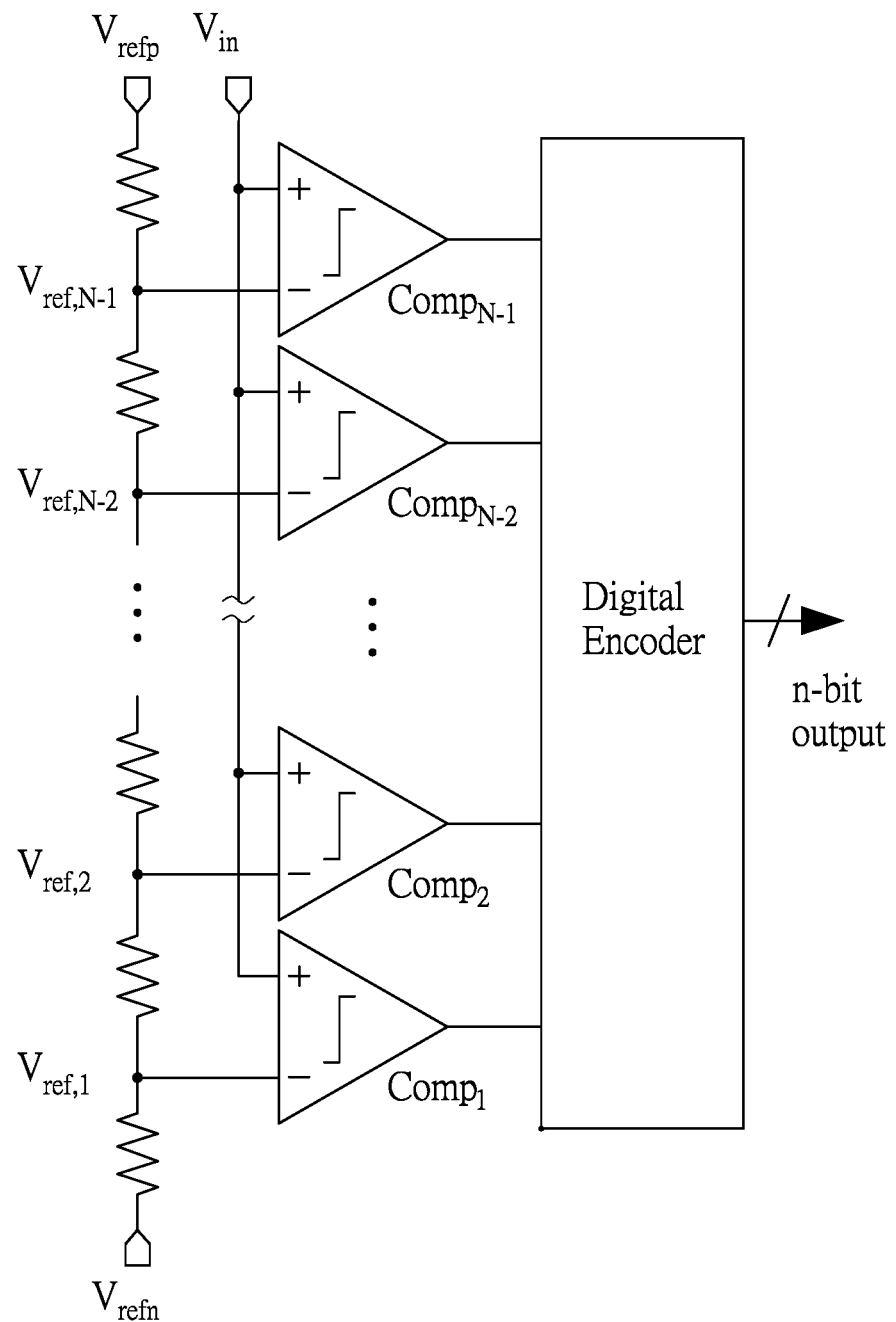
FIG. 9 is a circuit block diagram of a conventional flash ADC.
Figure 10:
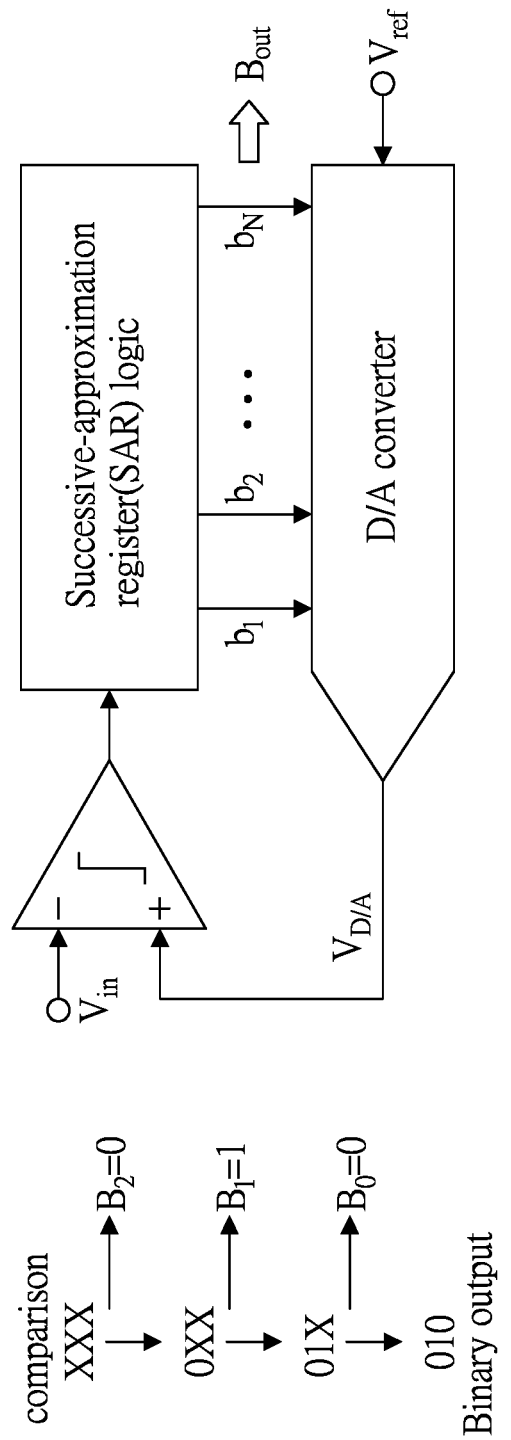
FIG. 10 is a circuit block diagram of a conventional SAR ADC.
Figure 11:
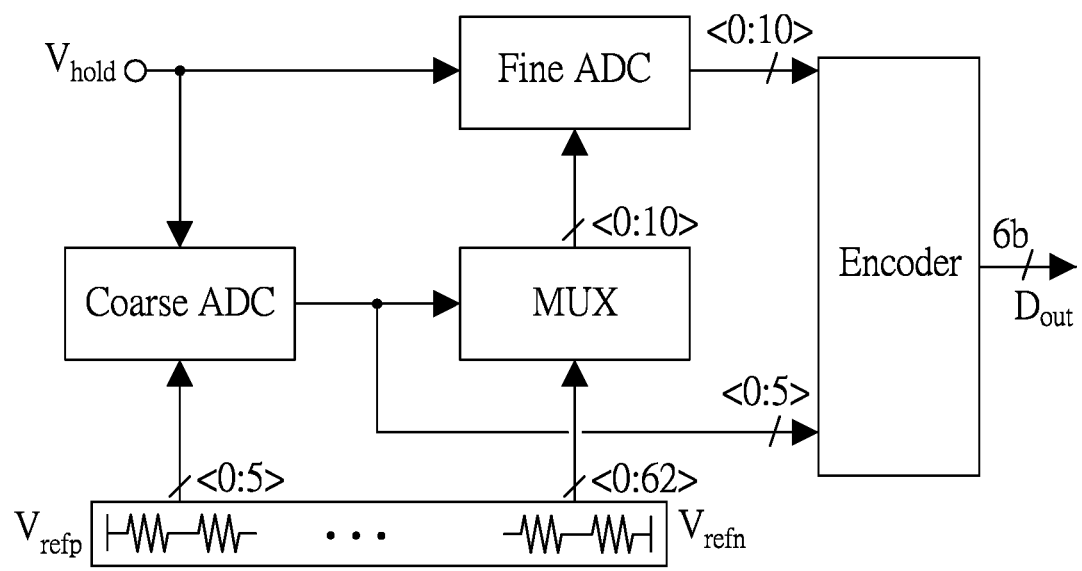
FIG. 11 is a circuit block diagram of a conventional subranging ADC.

With reference to FIG. 8D, to calibrate the bias voltage $V_{BIASP}$ of the three offset-adjustment cells 42 at the P-side of the fine ADC circuit 40, the input $D_{CRTLP}$ of the NAND gates 423 at the P-side is set to $D_{CTRLN}$=[110] and another input $D_{CRTLN}$ of the NAND gates 423 at the N-side is set to $D_{CRTLN}$=[000]. Because the three offset-adjustment cells 42 at the P-side share the same $V_{BIASP}$, only the calibration in region 6 is performed.

With the offset-adjustable comparators, the analog-to-digital converter 100 of the present invention has offsets as the embedded reference voltages instead of reference voltages provided by a resistor ladder. The embedded reference voltages are digitally controlled and fast switched, for example, the output code of the coarse ADC circuit 30 is directly output to control the offset-adjustable comparators in the fine ADC circuit 40. Therefore, in subranging operation, the entire analog input path without reference-voltage switching achieves high speed A/D conversion. In comparison to conventional Flash A/D converter, the 6-bit A/D converter of the present invention achieves a similar speed and the number of comparators is lowered from 64 to 17 (6 comparators for coarse ADC circuit and 11 comparators for fine ADC circuit). Thus, the area and power consumption required can be significantly reduced.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. An analog to digital converter with offset adjustable comparators, the analog to digital converter comprising:
   a track and hold circuit, tracking and holding an analog input signal to generate a sampled input signal;
   a clock generator generating clock signals;
   a coarse analog-to-digital conversion (ADC) circuit coupled to the track and hold circuit and comprising L offset-adjustable comparators to generate an L-bit output code, wherein each offset-adjustable comparator has a constant embedded offset as a reference voltage for comparing with the sampled input signal;
   a fine analog-to-digital conversion (ADC) circuit coupled to the coarse ADC circuit and the track and hold circuit and comprising M offset-adjustable comparators to generate a M-bit output code, wherein each of the offset-adjustable comparator has an adaptive embedded offset as a reference voltage that is determined by the L-bit output code of the coarse ADC circuit for comparing with the sampled input signal, and an appropriate input region that the sampled input signal corresponds to is determined based on the L-bit output code of the coarse ADC circuit; and
   an encoder combining the L-bit output code of the coarse ADC circuit and the M-bit output code of the fine ADC circuit to output a N-bit digital signal.

2. The analog to digital converter as claimed in claim 1, wherein the sampled input signal output by the track and hold circuit is differential input signals.

3. The analog to digital converter as claimed in claim 2, wherein the offset-adjustable comparators of the coarse ADC circuit have respective different constant embedded offsets, and each offset-adjustable comparator of the coarse ADC circuit comprises:
   a dynamic comparator having two input NMOS transistors for receiving the differential input signals;
   L offset-adjustment cells coupled to the dynamic comparator;
   wherein each constant embedded offset of the offset-adjustable comparator is determined by body voltages applied to the input NMOS transistors of the dynamic comparator and the L offset-adjustment cells of the offset-adjustable comparator.

4. The analog to digital converter as claimed in claim 3, wherein each of the offset-adjustment cell of the coarse ADC circuit comprises:
   a current source;
   a PMOS switch having a control terminal; and a NAND gate having an output terminal connected to the control terminal of the PMOS switch and being controlled by a fixed input value.

5. The analog to digital converter as claimed in claim 3, wherein for each offset-adjustable comparator of the coarse ADC circuit, half of the L offset-adjustment cells are commonly coupled to one of the input NMOS transistors, while the remaining offset-adjustment cells are commonly coupled to the other one of the input NMOS transistors.

6. The analog to digital converter as claimed in claim 2, wherein each offset-adjustable comparator of the fine ADC circuit comprises:
   a dynamic comparator having a pair of input NMOS for receiving the differential input signals;
   L offset-adjustment cells coupled to the dynamic comparator and digitally controlled by the L-bit output code of the coarse ADC circuit;
   wherein each adaptive embedded offset of the offset-adjustable comparator is determined by body voltages applied to the input NMOS and the L offset-adjustment cells in the offset-adjustable comparator.

7. The analog to digital converter as claimed in claim 6, wherein each of the offset-adjustment cell of the fine ADC circuit comprises:
   a current source;
   a PMOS switch having a control terminal; and
   a NAND gate having an output terminal connected to the control terminal of the PMOS switch and being adaptively controlled by the L-bit output code of the coarse ADC circuit.

8. The analog to digital converter as claimed in claim 6, wherein for each offset-adjustable comparator of the fine ADC circuit, half of the L offset-adjustment cells are commonly coupled to one of the input NMOS transistors, while the remaining offset-adjustment cells are commonly coupled to the other one of the input NMOS transistors.

9. The analog to digital converter as claimed in claim 1 further comprising a calibration circuit connected to the coarse ADC circuit and the fine ADC circuit for calibrating the coarse ADC circuit and the fine ADC circuit.

10. The analog to digital converter as claimed in claim 9, wherein the calibration circuit comprises an auxiliary resistor ladder, a plurality of detection circuits and a plurality of calibration digital to analog converters.

* * * * *